United States Patent
Watanabe et al.

(10) Patent No.: US 9,787,315 B1
(45) Date of Patent: Oct. 10, 2017

(54) CONTROL DEVICE AND ANALOG-TO-DIGITAL CONVERSION CONTROLLING METHOD

(71) Applicant: FUJITSU TEN LIMITED, Kobe-shi, Hyogo (JP)

(72) Inventors: Masatoshi Watanabe, Kobe (JP); Shigeto Umeyama, Kobe (JP); Masanori Akaza, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 0 days.

(21) Appl. No.: 15/600,231

(22) Filed: May 19, 2017

(30) Foreign Application Priority Data

Jul. 20, 2016 (JP) ................... 2016-142775

(51) Int. Cl.
H03M 1/12 (2006.01)
H03M 1/06 (2006.01)
H03M 1/14 (2006.01)

(52) U.S. Cl.
CPC ......... *H03M 1/0624* (2013.01); *H03M 1/146* (2013.01)

(58) Field of Classification Search
CPC ... H03M 1/0624; H03M 1/146; H01H 47/325

USPC .................. 341/155; 361/139, 152, 154, 160
See application file for complete search history.

(56) References Cited

U.S. PATENT DOCUMENTS

| 6,934,140 B1 * | 8/2005 | Rober ................. H01H 47/325 361/154 |
| 7,872,845 B2 * | 1/2011 | Williams ............. H01F 7/1844 323/283 |
| 2004/0187820 A1 | 9/2004 | Kondo |

FOREIGN PATENT DOCUMENTS

JP         2004-301224 A    10/2004

* cited by examiner

*Primary Examiner* — Khai M Nguyen
(74) *Attorney, Agent, or Firm* — Oliff PLC

(57) ABSTRACT

A control device according to an embodiment includes a driving unit that supplies, to a control target, a current or a voltage on which an Alternating-Current (AC) component is superimposed, an Analog-to-Digital (AD) converter, and an AD conversion controller. The AD conversion controller causes, in an AC cycle of the AC component, the AD converter to execute a first AD conversion in synchronization with a starting timing of the AC cycle, and then to execute second and subsequent AD conversions at predetermined time intervals in response to a trigger by an internal timer of the AD converter.

7 Claims, 9 Drawing Sheets

CONTROL DEVICE AND ANALOG-TO-DIGITAL CONVERSION CONTROLLING METHOD

CROSS-REFERENCE TO RELATED APPLICATION

This application is based upon and claims the benefit of priority of the prior Japanese Patent Application No. 2016-142775, filed on Jul. 20, 2016, the entire contents of which are incorporated herein by reference.

FIELD

The embodiment discussed herein is directed to a control device and an analog-to-digital conversion controlling method.

BACKGROUND

Recently, a linear solenoid is used in, for example, an automatic transmission, a variable intake and exhaust valve, etc. The linear solenoid is a solenoid that linearly changes a position of a valve body (movable body) in accordance with the supplied current. In controlling this linear solenoid, a dither control, which vibrates the valve body, is performed to improve a sliding property thereof by reducing the friction between a housing and the valve body such as a spool (for example, see Japanese Laid-open Patent Publication No. 2004-301224)

The aforementioned dither control is performed by supplying the current including a superimposed dither component, which is an Alternating-Current (AC) component, to the linear solenoid, and the amplitude of this dither component is controlled to be a target value. Therefore, the current supplied to the linear solenoid is detected more than once in one dither cycle so that the amplitude of the dither component supplied to the linear solenoid can be detected.

When this current detection is performed through the Analog-to-Digital (AD) conversions, it is desirable that timings of the AD conversions are appropriately set so that the amplitude of the dither component can be detected. The same is applied to the case where the detection of the current or the voltage supplied to a control target is performed through the AD conversions in a control device that supplies, to the control target, the current or the voltage including a superimposed AC component that is not limited to the dither component.

SUMMARY

According to an aspect of an embodiment, a control device includes a driving unit, an output unit, an Analog-to-Digital (AD) converter, and an AD conversion controller. The driving unit supplies, to a control target, a current or a voltage on which an Alternating-Current (AC) component is superimposed. The output unit outputs a detection voltage according to the current or the voltage supplied to the control target from the driving unit. The AD converter performs an AD conversion on the detection voltage. The AD conversion controller causes, in an AC cycle of the AC component, the AD converter to execute a first AD conversion in synchronization with a starting timing of the AC cycle, and then to execute second and subsequent AD conversions at predetermined time intervals in response to a trigger by an internal timer of the AD converter.

BRIEF DESCRIPTION OF DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF EMBODIMENT

Hereinafter, an embodiment of a control device and an Analog-to-Digital (AD) conversion controlling method will be described in detail with reference to the accompanying drawings. Moreover, the disclosed technology is not limited to the embodiment described below.

1. Control Device

Figure 1A:
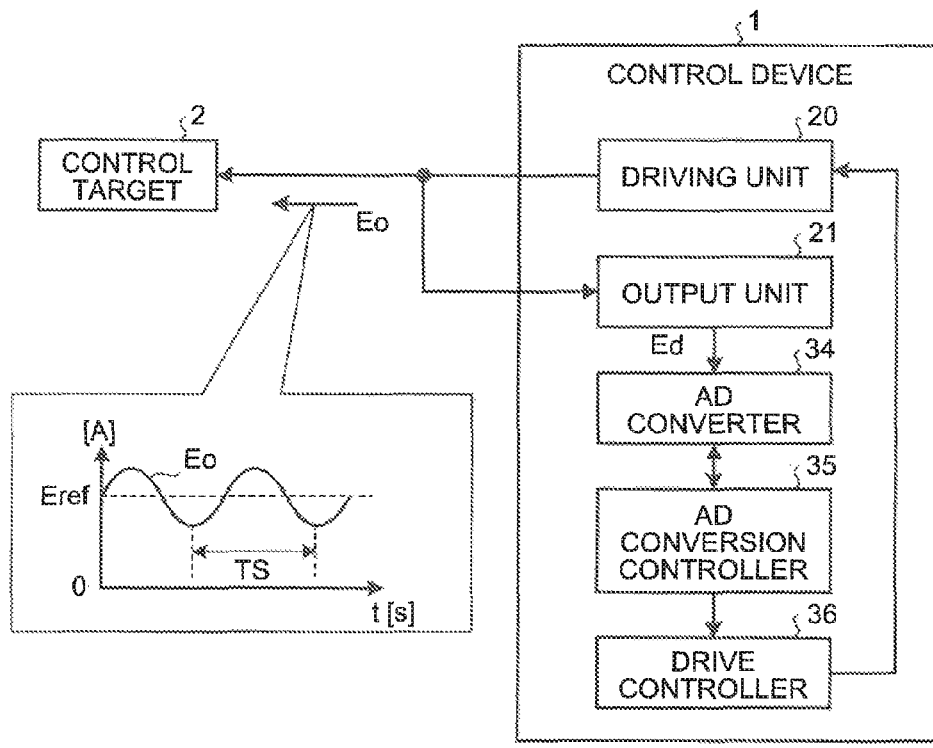
FIG. 1A is a diagram illustrating one example of a control device according to an embodiment.

FIG. 1A is a diagram illustrating one example of a control device according to the embodiment. As illustrated in FIG. 1A, a control device 1 supplies, to a control target 2, a driving signal Eo that is the voltage or the current including a superimposed Alternating-Current (AC) component so as to control the control target 2.

This control device 1 includes a driving unit 20, an output unit 21, an Analog-to-Digital (AD) converter 34, an AD conversion controller 35, and a drive controller 36.

The driving unit 20 supplies the driving signal Eo to the control target 2. The output unit 21 detects the driving signal Eo that is supplied to the control target 2 from the driving unit 20, and outputs, to the AD converter 34, the voltage (hereinafter, may be referred to as "detection voltage Ed") corresponding to an instantaneous voltage value of the detected driving signal Eo. The AD converter 34 AD-converts the detection voltage Ed to generate an AD-converted value Edd of a digital value.

The AD conversion controller 35 causes the AD converter 34 to execute an AD conversion at "N (N≥3)" timings in an AC cycle TS of the AC component superimposed on the driving signal Eo to acquire the "N" AD-converted values Edd for each of the AC cycles TS. The drive controller 36 detects the average value of the driving signal Eo and the amplitude of the AC component on the basis of the "N" AD-converted values Edd acquired by the AD conversion controller 35, and controls the driving signal Eo, which is supplied to the control target 2 from the driving unit 20, on the basis of this detected result.

Herein, the AD converter 34 is assumed to be able to execute an AD conversion process in response to an external trigger (for example, software trigger or hardware trigger) and an AD conversion process in response to an internal trigger (for example, trigger by internal timer of AD converter 34).

It is assumed that the AD conversion controller 35 causes this AD converter 34 to execute "N" AD conversions (hereinafter, may be referred to as "AD conversion group") in the AC cycle TS of the AC component. In a case where the AC cycle TS is changed, when one AD conversion group extends over the AC cycles TS before and after the change, there exists a fear that the AC component and a basic component of the driving signal Eo are not detected accurately. Therefore, it is desirable that the AD conversion group is within one AC cycle TS even when the AC cycle TS is changed.

The AD converter 34 may execute the AD conversion in response to the external trigger for each AD conversion in the AC cycle TS so that the AD conversion group becomes within one AC cycle TS, however, the processing load increases because an interruption process is frequently generated.

When the AD conversion controller 35 requests the AD converter 34 to execute "N" AD conversions in response to the internal trigger in the AC cycle TS, a processing time until the AD conversion is generated for each request in the AD converter 34. Therefore, when the length of the AC cycle TS is changed, the timings of the AD conversion group delay so that one AD conversion group extends over the AC cycles TS before and after the change, and thus there exists a fear that the AC component of the driving signal Eo is not detected accurately.

Figure 1B:
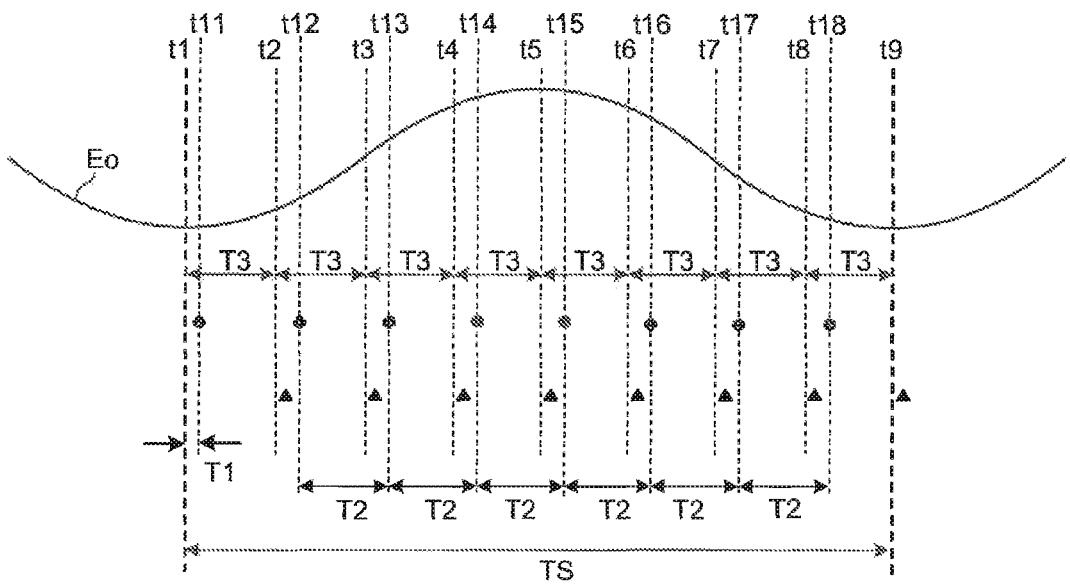
FIG. 1B is a diagram illustrating timings at which an Analog-to-Digital (AD) conversion controller causes an AD converter to execute AD conversions.

When the interruption is generated at a starting timing of the AC cycle TS and the AD converter 34 performs a plurality of AD conversions in response to the internal trigger, as illustrated in FIG. 1B by black triangles, the AD conversion group (for example, eight AD-converted values Edd illustrated in FIG. 1B) extends over the AC cycles TS before and after the change in the time period length. FIG. 1B is a diagram illustrating timings at which the AD conversion controller 35 causes the AD converter 34 to execute the AD conversions.

Therefore, the AD conversion controller 35 first requests, as illustrated in FIG. 1B by black circles, the AD converter 34 to execute one AD conversion in response to the external trigger or the internal trigger in the AC cycle TS of the AC component so as to cause the AD converter 34 to execute the first AD conversion at a timing (one example of timing synchronized with starting timing of AC cycle TS) in a first time T1 started from a starting timing of the AC cycle TS.

Subsequently, the AD conversion controller 35 sets, as interval times, a second time T2 that is longer than the first time T1, and further requests the AD converter 34 to perform AD conversions in response to the internal trigger (hereinafter, may be referred to as "interval timer trigger") whose number of repeated counts is set to be "N−1". The second time T2 satisfies, for example, "T2=TS/N", and is set on the basis of the AC cycle TS and "N" that is the number of counts of the AD conversions.

Thus, the AD conversion controller 35 causes the AD converter 34 to execute the second to N-th AD conversions (for example, second to eighth AD conversions illustrated in FIG. 1B) in response to the internal trigger at intervals of the second time T2 longer than the first time T1.

Therefore, the processing load of the AD conversion controller 35 can be reduced compared with the case where the AD conversion using, for each AD conversion, the corresponding external trigger is requested for "N" times, moreover, can reduce the timing delays of the AD conversions compared with all of the AD conversions in the AC cycle TS are executed in response to the internal trigger.

Therefore, the AD conversion timings for the AC component can be set appropriately while reducing the processing load. Hereinafter, one example of a control system including the control device 1, which controls the current to be supplied to a linear solenoid valve, will be explained as one example of a system including the control device 1 and the control target 2.

2. Control System

Figure 2:
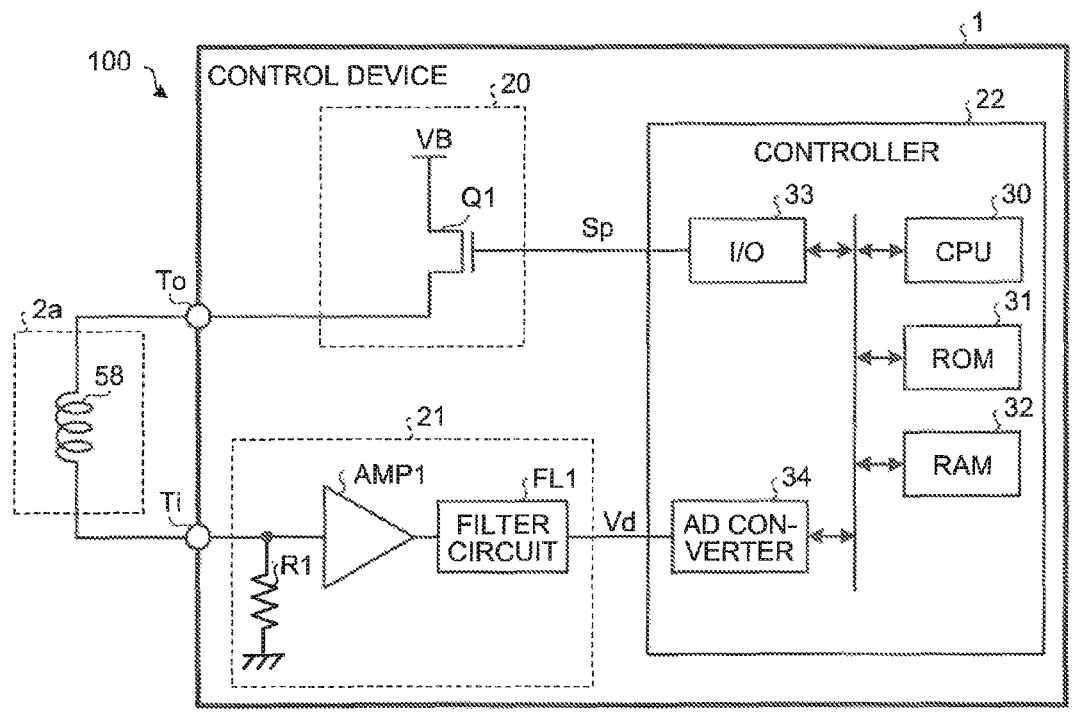
FIG. 2 is a diagram illustrating one example of a control system according to the embodiment.

FIG. 2 is a diagram illustrating one example of the control system according to the embodiment. A control system 100 illustrated in FIG. 2 includes the control device 1 and a linear solenoid valve 2a controlled by this control device 1. The control device 1 includes a driving unit 20, an output unit 21, and a controller 22.

The driving unit 20 intermittently outputs a power-supply voltage VB to a terminal To on the basis of a Pulse Width Modulation (PWM) signal Sp output from the controller 22 so as to lead a driving current Io including a superimposed dither component (namely, one example of AC component) to a magnet coil 58 of the linear solenoid valve 2a.

This driving unit 20 includes a switching element Q1 such as a Metal-Oxide Semiconductor Field-Effect Transistor (MOSFET) and an Insulated Gate Bipolar Transistor (IGBT), and the PWM signal Sp turns ON/OFF this switching element Q1 so as to intermittently output the power-supply voltage VB to the terminal To. The configuration of the driving unit 20 is not limited to that illustrated in FIG. 2, and it is sufficient that the driving current Io is led to the magnet coil 58 on the basis of the PWM signal Sp.

The output unit 21 outputs the voltage (hereinafter, may be referred to as "detection voltage Vd") in accordance with an instantaneous value of the driving current Io led to the magnet coil 58. This output unit 21 includes, for example, a resistance R1, an amplifier AMP1, and a filter circuit FL1. The resistance R1 is connected between the gland voltage and a terminal Ti whose one end is connected with the magnet coil 58, and thus the voltage of this resistance R1 is according to the driving current Io.

The amplifier AMP1 amplifies the voltage of the resistance R1, and outputs the amplified voltage to the filter circuit FL1. The filter circuit FL1 includes, for example, a low-pass filter to remove a high-frequency component included in the output of the amplifier AMP1 so as to acquire the detection voltage Vd (namely, one example of detection voltage Ed), and outputs this detection voltage Vd to the controller 22. The configuration of the output unit 21 is not limited to that illustrated in FIG. 2, and it is sufficient that the detection voltage Vd according to an instantaneous value of the driving current Io led to the magnet coil 58 can be output.

As illustrated in FIG. 2, the controller 22 includes a Central Processing Unit (CPU) 30, a Read Only Memory (ROM) 31, a Random Access Memory (RAM) 32, an input/output (I/O) port 33, the AD converter 34, etc., and they are connected with one another by a bus.

The CPU 30 reads out a program memorized in the ROM 31 to execute the program by using the RAM 32 as a work area. Thus, the controller 22 functions as, for example, the AD conversion controller 35 and the drive controller 36 (see FIG. 4) to be mentioned later. A part or whole of each of the units may be constituted of only hardware.

Figure 3:
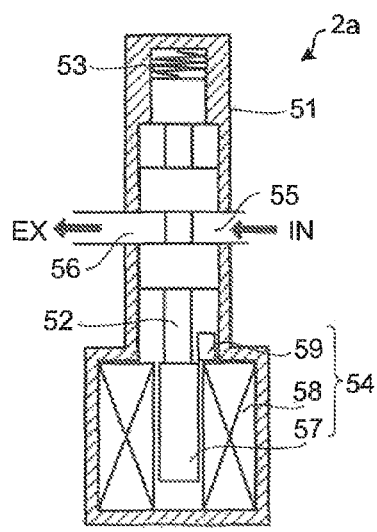
FIG. 3 is a diagram illustrating a configuration example of a linear solenoid valve.

FIG. 3 is a diagram illustrating a configuration example of the linear solenoid valve 2a. As illustrated in FIG. 3, the linear solenoid valve 2a includes, a valve housing 51, a spool 52, a spring 53, and a linear solenoid 54 (namely, one example of control target 2).

The valve housing 51 is formed hollow cylindrically, and includes an input port 55 and an output port 56. The spool 52 is energized by the spring 53, and arranged so that the spool 52 can linearly slide in the valve housing 51. The linear solenoid 54 includes a plunger 57, a magnet coil 58 opposing to the outer periphery of the plunger 57 while placing an air gap therebetween, and a position sensor 59. The plunger 57 moves in response to the driving current Io that is supplied to the magnet coil 58 from the control device 1.

The spool 52 is connected with the plunger 57, and slides in the valve housing 51 in accordance with the movement of the plunger 57. Thus, the flow volume of the gas (or liquid) from the input port 55 to the output port 56 is adjusted. The position sensor 59 detects a movement position (namely, lift amount) of the plunger 57.

The aforementioned linear solenoid valve 2a constitutes, for example, an exhaust gas recirculating mechanism that reduces nitrogen oxides in exhaust gas exhausted by combustion in an internal-combustion engine, however, the control device 1 may be employed to various systems.

Figure 4:
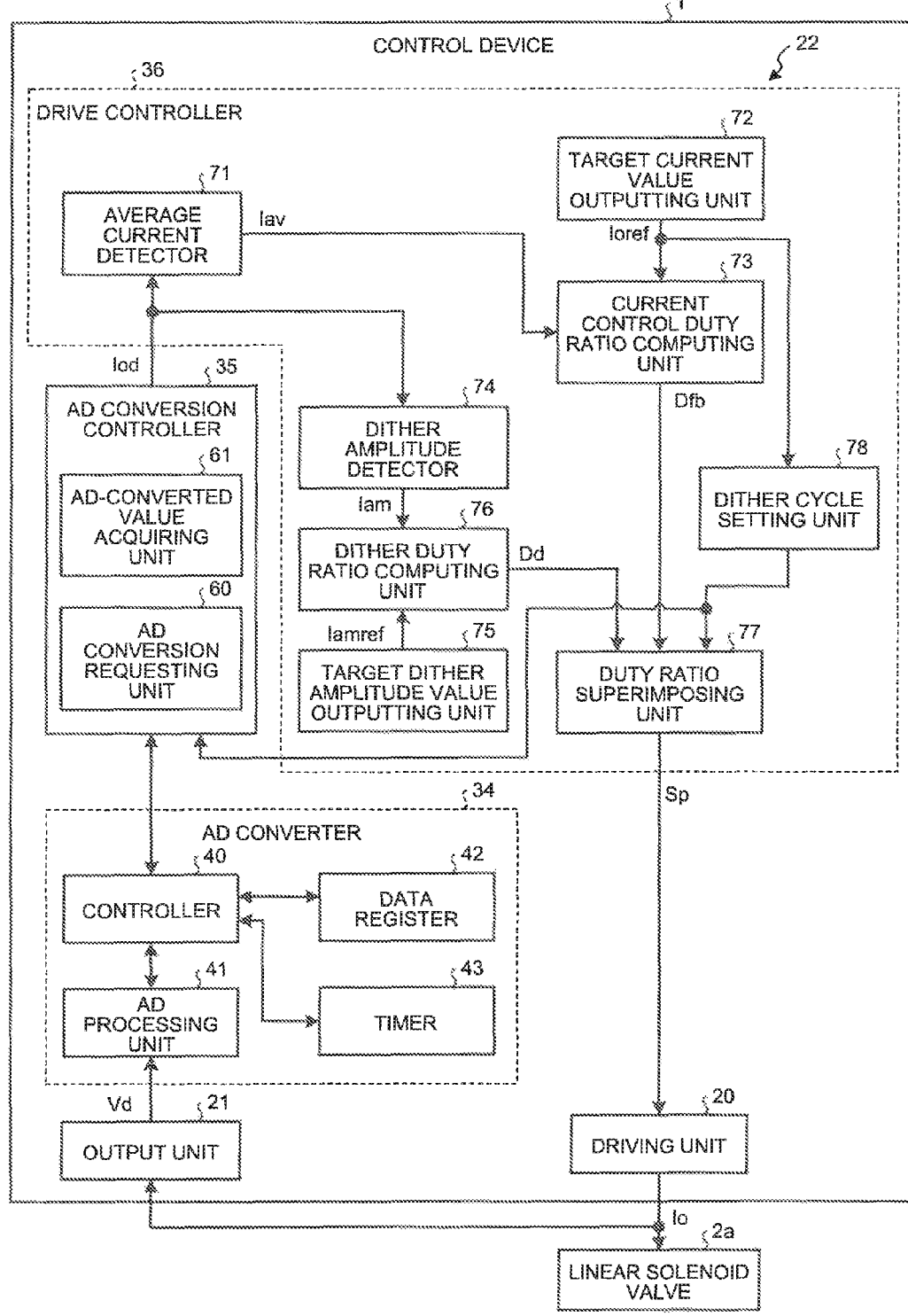
FIG. 4 is a diagram illustrating functional blocks of a controller and a configuration example of the AD converter.

FIG. 4 is a diagram illustrating functional blocks of the controller 22 and a configuration example of the AD converter 34. As illustrated in FIG. 4, the controller 22 functions as the AD conversion controller 35 and the drive controller 36.

The AD conversion controller 35 includes an AD conversion requesting unit 60 and an AD-converted value acquiring unit 61. The AD conversion requesting unit 60 requests the AD converter 34 to execute the AD conversion of the detection voltage Vd (hereinafter, may be referred to as "AD conversion request"). The AD-converted value acquiring unit 61 acquires, from the AD converter 34, an AD-converted value Iod (digital value of detection voltage Vd) generated by the AD conversion of the AD converter 34.

The drive controller 36 can perform the dither control on the linear solenoid 54 while driving the linear solenoid 54 of the linear solenoid valve 2a. The dither control is a control that gives a constant fluctuation to a target control amount that is a target control value of the linear solenoid 54 so as to improve the drive responsiveness of the linear solenoid 54.

This drive controller 36 includes an average current detector 71, a target current value outputting unit 72, a current control duty ratio computing unit 73, a dither amplitude detector 74, a target dither amplitude value outputting unit 75, a dither duty ratio computing unit 76, a duty ratio superimposing unit 77, and a dither cycle setting unit 78.

The average current detector 71 averages the AD-converted values Iod (one example of AD-converted values Edd) acquired in a period of the AC cycle TS by the AD conversion controller 35 so as to detect the obtained value as an average current value Iav. For example, the average current detector 71 can obtain the average current value Iav by performing the moving average operation in a time period that is equal to or longer than the AC cycle TS.

The target current value outputting unit 72 generates and outputs a target current value Ioref (one example of Eref illustrated in FIG. 1A) corresponding to a target value of a control amount of the plunger 57. The current control duty ratio computing unit 73 performs Proportional-Integral control (PI control) or Proportional-Integral-Derivative control (PID control) so that the differential between the average current value Iav and the target current value Ioref becomes less or zero so as to generate a current-feedback duty ratio Dfb.

The dither amplitude detector 74 detects an amplitude value Ia of the dither component included in the driving current Io. This dither amplitude detector 74 detects, for example, for each period of the AC cycle TS, a minimum value Iodmin and a maximum value Iodmax of the AD-converted value Iod, which are acquired by the AD conversion controller 35, and computes an amplitude value Iam (=Iodmax−Iodmin) of the dither component on the basis of this detected result.

The target dither amplitude value outputting unit 75 generates and outputs a target amplitude value Iamref that is a target value of the amplitude value of the dither component. This target dither amplitude value outputting unit 75 can change the target amplitude value Iamref on the basis of, for example, the target current value Ioref output from the target current value outputting unit 72. The dither duty ratio computing unit 76 performs PI control or PID control so that the difference between the amplitude value Iam and the target amplitude value Iamref becomes less or zero so as to generate a dither-duty ratio Dd.

Figure 5:
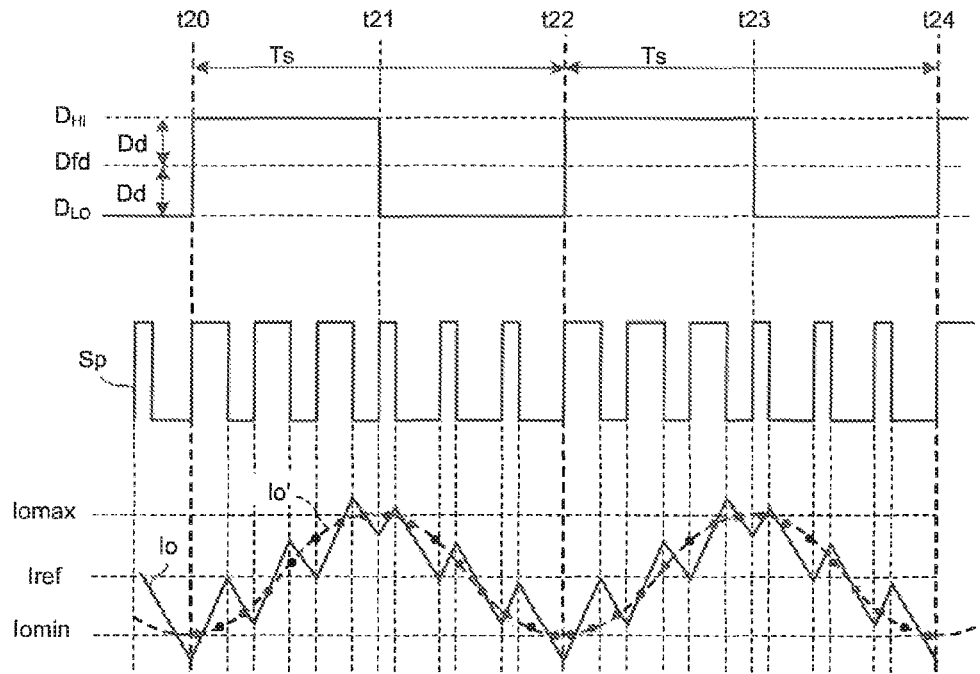
FIG. 5 is a diagram illustrating relationship between a current-feedback duty ratio, a dither-duty ratio, a Pulse Width Modulation (PWM) signal, an output current, and a detected current value.

The duty ratio superimposing unit 77 superimposes the dither-duty ratio Dd on the current-feedback duty ratio Dfb to generate the PWM signal Sp. FIG. 5 is a diagram illustrating relationship between the current-feedback duty ratio Dfb, the dither-duty ratio Dd, the PWM signal Sp, the driving current Io, and a detected current value Io'. The detected current value Io' is a current value of the driving current Io detected through the filter circuit FL1.

As illustrated in FIG. 5, the duty ratio superimposing unit 77 adds the dither-duty ratio Dd to the current-feedback duty ratio Dfb to generate a Hi-side duty ratio Dz. The duty ratio superimposing unit 77 subtracts the dither-duty ratio Dd from the current-feedback duty ratio Dfb to generate a Lo-side duty ratio $D_{LO}$.

The duty ratio superimposing unit 77 generates the PWM signal Sp whose duty ratio is the same as the Hi-side duty ratio $D_{HI}$ in the first half time period of each of the AC cycles TS (time from t20 to t21 and time from t22 to t23). The duty ratio superimposing unit 77 generates the PWM signal Sp whose duty ratio is the same as the Lo-side duty ratio $D_{LO}$ in the second half time period of each of the AC cycles TS (time from t21 to t22 and time from t23 to t24).

The PWM signal Sp, which is generated by this duty ratio superimposing unit 77, turns ON/OFF the switching element Q1 (see FIG. 2) of the driving unit 20 so as to intermittently output the power-supply voltage VB to the terminal To. Thus, the driving current Io on which the dither component is superimposed is output to the magnet coil 58 of the linear solenoid valve 2a from the driving unit 20.

Returning to FIG. 4, the control device 1 will be continuously explained. The dither cycle setting unit 78 of the control device 1 changes the dither cycle Ts on the basis of a predetermined condition. For example, the dither cycle setting unit 78 changes the dither cycle Ts in accordance with the temperature of the gas or liquid, which is adjusted by the linear solenoid valve 2a.

The AD conversion controller 35 and the duty ratio superimposing unit 77 are notified of information on the length of the dither cycle Ts from the dither cycle setting unit 78, for example, at a timing before the length of the dither cycle Ts is changed.

The dither cycle setting unit 78 performs an interruption (hereinafter, may be referred to as "PWM interruption") on the AD conversion controller 35 and the duty ratio superimposing unit 77 at a timing when a period of the dither cycle Ts (one example, AC cycle TS) is started. Thus, a process synchronized with the PWM interruption is executed on the AD conversion controller 35 and the duty ratio superimposing unit 77.

For example, the AD conversion controller 35 starts an AD conversion request process at a timing of the PWM interruption, and the duty ratio superimposing unit 77 starts to generate the one-cycle PWM signal Sp at the timing (times t20 and t22 illustrated in FIG. 5) of the PWM interruption.

Next, the AD converter 34 illustrated in FIG. 4 will be explained. The AD converter 34 communicates with the AD conversion controller 35, AD-converts the detection voltage Vd output from the output unit 21 to generate the AD-converted value Iod, and outputs this AD-converted value Iod to the AD conversion controller 35.

The AD converter 34 includes a controller 40, an AD processing unit 41, a data register 42, and a timer 43 (one example of internal timer). The controller 40 communicates with the AD processing unit 41, the data register 42, and the timer 43.

The controller 40 causes the AD processing unit 41 to execute the AD conversion so as to generate the AD-converted value Iod in response to an AD conversion request from the AD conversion requesting unit 60, and acquires this AD-converted value Iod from the AD processing unit 41 to memorize the AD-converted value Iod in the data register 42. The controller 40 delivers, to the AD-converted value acquiring unit 61, the AD-converted value Iod memorized in the data register 42 in response to an AD-converted value acquiring request from the AD-converted value acquiring unit 61.

The AD conversion requesting unit 60 executes an AD conversion request on the AD converter 34, which differs in accordance with the set mode and the presence/absence of change in the AC cycle TS. For example, the AD conversion requesting unit 60 can select any of a first-mode AD conversion request, a second-mode AD conversion request, and a third-mode AD conversion request to execute the AD conversion request on the AD converter 34. Hereinafter, the first, second, and third modes will be explained in this order.

Figure 6:
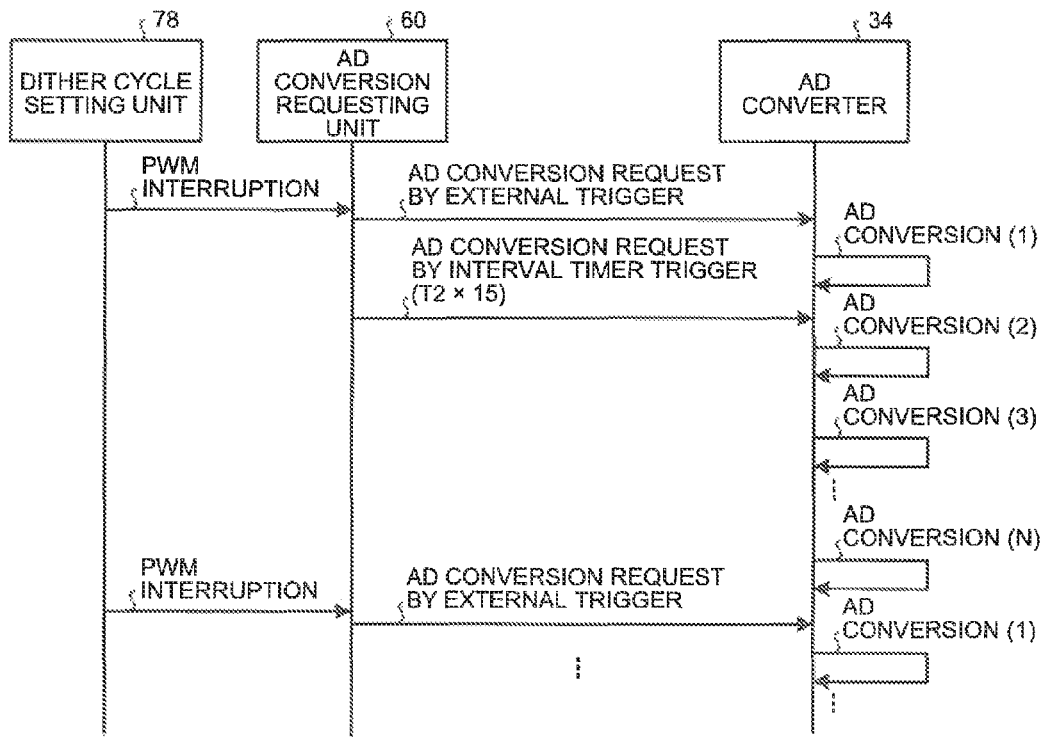
FIG. 6 is a diagram illustrating AD conversions caused by a first-mode AD conversion request.

The AD conversion requesting unit 60 sequentially performs, on the AD converter 34, an AD conversion request by the external trigger and an AD conversion request by the internal trigger (namely, aforementioned interval timer trigger) so as to perform the first-mode AD conversion request. FIG. 6 is a diagram illustrating the AD conversions caused by the first-mode AD conversion request.

As illustrated in FIG. 6, when there exists a PWM interruption from the dither cycle setting unit 78, the AD conversion requesting unit 60 of the AD conversion controller 35 performs, at this PWM-interruption timing, an AD conversion request by the external trigger on the AD converter 34.

When there exists an AD conversion request by the external trigger from the AD conversion requesting unit 60, the controller 40 of the AD converter 34 causes the AD processing unit 41 to immediately start the first AD conversion. Thus, the AD conversion requesting unit 60 can cause the AD converter 34 to execute the first AD conversion in the first time T1 from the PWM-interruption timing (for example, time t20 or t22 illustrated in FIG. 5).

The AD conversion request by the external trigger includes an AD conversion request using software and an AD conversion request using hardware. The AD conversion request using software is performed, for example, by causing the AD conversion requesting unit 60 to rewrite an AD conversion starting flag in a control register (not illustrated) of the controller 40 into an active value (for example, "1"). When the AD conversion starting flag turned active, the controller 40 causes the AD processing unit 41 to start the AD conversion.

The AD conversion request using hardware is performed by an input of an active signal (for example, signal change from Low level to High level) from the AD conversion requesting unit 60 to an interruption terminal of the controller 40. When there exists an input of an active signal to the interruption terminal, the controller 40 rewrites the aforementioned AD conversion starting flag in the control register into the active value so as to cause the AD processing unit 41 to start an AD conversion.

When the AD conversion according to the AD conversion request caused by the external trigger is terminated, the controller 40 rewrites the AD conversion starting flag into a non-active value while performing, on the AD conversion controller 35, a notification or an interruption (hereinafter, may be referred to as "AD conversion completing interruption") indicating that the AD conversion is completed.

When there exists an AD conversion completing interruption, the AD conversion controller 35 executes, on the AD converter 34, a request of an AD conversion caused by the interval timer trigger, whose interval time is set to the second time T2 that is longer than the first time T1 and whose number of repeated counts of AD conversions is set to be "N−1" (N≥3). The AD conversion controller 35 sets the second time T2 on the basis of information on the length of the dither cycle Ts (inverse number of dither-component frequency fs) sent from the dither cycle setting unit 78 so that, for example, "T2=Ts/N" is satisfied.

When there exists an AD conversion request caused by an interval timer trigger from the AD conversion controller 35, the controller 40 causes the timer 43 to start to count so as to cause the AD processing unit 41 to start an AD conversion at each time when the count value of the timer 43 becomes the second time T2. Thus, the AD converter 34 executes the second to N-th AD conversions at intervals of the second time T2, each of which is longer than the first time T1.

The "N" AD-converted values Iod, which are generated by the respective "N" AD conversions executed in a time period of the dither cycle Ts, are memorized in the data register 42. The controller 40 reads the "N" AD-converted values Iod from the data register 42 in response to a request of the AD-converted value acquiring unit 61, and outputs the read "N" AD-converted values Iod to the AD-converted value acquiring unit 61.

The controller 40 needs a processing time T4 until the AD processing unit 41 starts an AD conversion in response to the AD conversion request caused by the interval timer trigger. Therefore, a time period T5 (=T2+T4) between the first AD conversion timing and the second AD conversion timing becomes longer than the second time T2, however, because there exists relationship of "T4<T2−T1", the "N" AD conversions are executed in the period of the dither cycle Ts.

When "N" counts of AD conversion requests by the respective external triggers are performed on the "N" AD conversions in a time period of the dither cycle Ts, "N" counts of AD conversion completing interruptions are performed on the AD conversion controller 35. Therefore, the interruption process is frequently generated in the AD conversion controller 35, and thus the processing load thereof increases.

The controller 40 includes an addition unit that sequentially adds the AD-converted values Iod acquired by the AD processing unit 41, and, when using an addition result of this addition unit, only the addition result is sent to the AD conversion controller 35 from the controller 40. Therefore, it becomes difficult that the dither amplitude detector 74 detects the minimum value Iodmin and the maximum value Iodmax of the AD-converted value Iod, and thus the detection accuracy of the amplitude value Ia in the dither component may be worse.

It is assumed that the interval time is set to be the second time T2, and the AD conversion request by an interval timer trigger, whose number of AD conversion counts is set to be "N", is performed on the AD converter 34. In this case, the first AD conversion is executed at the time later than the second time T2 and by the processing time T4, and thus it is impossible to execute AD conversions at respective timings of the time period T3 unit (see FIG. 1B), which are obtained by dividing the dither cycle Ts into equal intervals. Therefore, there exists a fear that "N" AD conversions do not complete in the dither cycle Ts (see FIG. 1B), and further there exists a fear that it is impossible to detect an average value and a dither component of the driving current Io accurately.

On the other hand, the AD conversion controller 35 requests the AD converter 34 to execute the AD conversion in response to an external trigger at the PWM-interruption timing, and thus causes the AD converter 34 to execute the first AD conversion in the first time T1 after an AD conversion request is started. When there exists an AD conversion completing interruption of the first AD conversion from the AD converter 34, the AD conversion controller 35 requests, for example, the AD converter 34 to execute an AD conversion in response to an interval trigger by the timer 43 of the AD converter 34, and thus causes for example, the AD converter 34 to execute the second and subsequent AD conversions at intervals of the second time T2.

Thus, the AD conversions can be executed at respective timings of the time period T3 unit (see FIG. 1B), which are obtained by equally dividing the dither cycle Ts by "N", and thus, even when, for example, the AC cycle TS is changed, AD conversion timings of the driving current Io including a dither component can be appropriately set while reducing the processing load.

Figure 7:
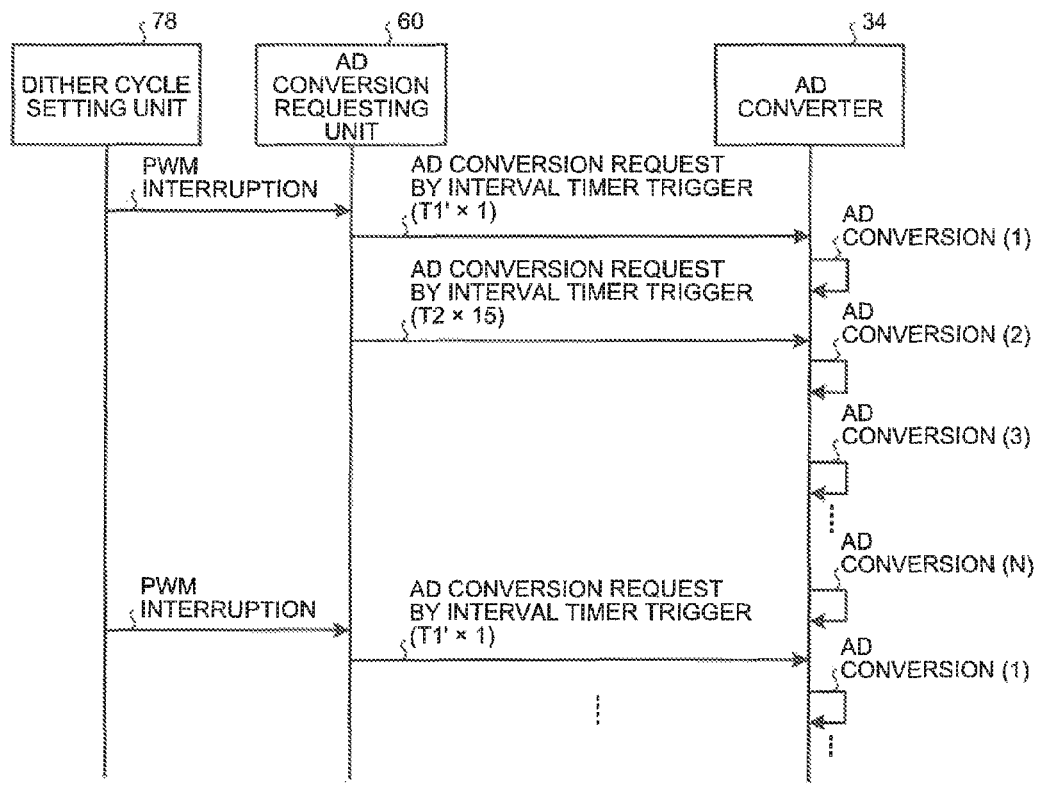
FIG. 7 is a diagram illustrating AD conversions caused by a second-mode AD conversion request.

Next, the second mode will be explained. The AD conversion requesting unit 60 performs, on the AD converter 34, AD conversion requests by two internal triggers whose interval times and repeated counts are different from each other so as to execute the second-mode AD conversion request. FIG. 7 is a diagram illustrating the AD conversions caused by the second-mode AD conversion request.

As illustrated in FIG. 7, when there exists a PWM interruption from the dither-cycle setting unit, the AD conversion requesting unit 60 of the AD conversion controller 35 performs, on the AD converter 34, an AD conversion request caused by an interval timer trigger whose interval time is set to be a time T1'(≤T1−T4) that is shorter than the first time T1 and whose number of repeated counts of AD conversions is set to be one.

In a case where there exists this AD conversion request, when the count value of the timer 43 caused by the interval timer trigger becomes a value corresponding to the time T1', the controller 40 causes the AD processing unit 41 to start an AD conversion. Thus, the AD converter 34 executes the first AD conversion in the first time T1 from the PWM-interruption timing. When the AD conversion is terminated, the controller 40 performs an AD conversion completing interruption on the AD conversion controller 35 while rewriting the AD conversion starting flag into a non-active value.

When there exists an AD conversion completing interruption, similarly to the case of the first mode, the AD conversion controller 35 performs, on the AD converter 34, an AD conversion request by using an interval timer trigger whose interval time is set to be the first time T2 that is longer than the second time T1 and whose number of repeated counts of AD conversions is set to be "N−1". Thus, the AD converter 34 executes the second to N-th AD conversions at intervals of the second time T2 longer than the first time T1.

Thus, the AD conversions can be also executed at respective timings of the time period T3 unit (see FIG. 1B), which are obtained by equally dividing the dither cycle Ts by "N", and thus, even when, for example, the AC cycle TS is changed, AD conversion timings of the driving current Io including a superimposed dither component can be appropriately set while reducing the processing load.

Figure 8:
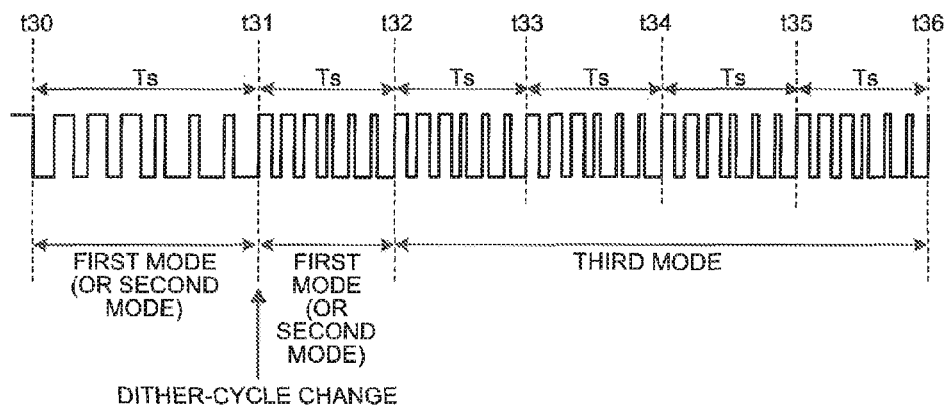
FIG. 8 is a diagram illustrating one example of relationship between execution modes and change in dither cycles.
Figure 9:
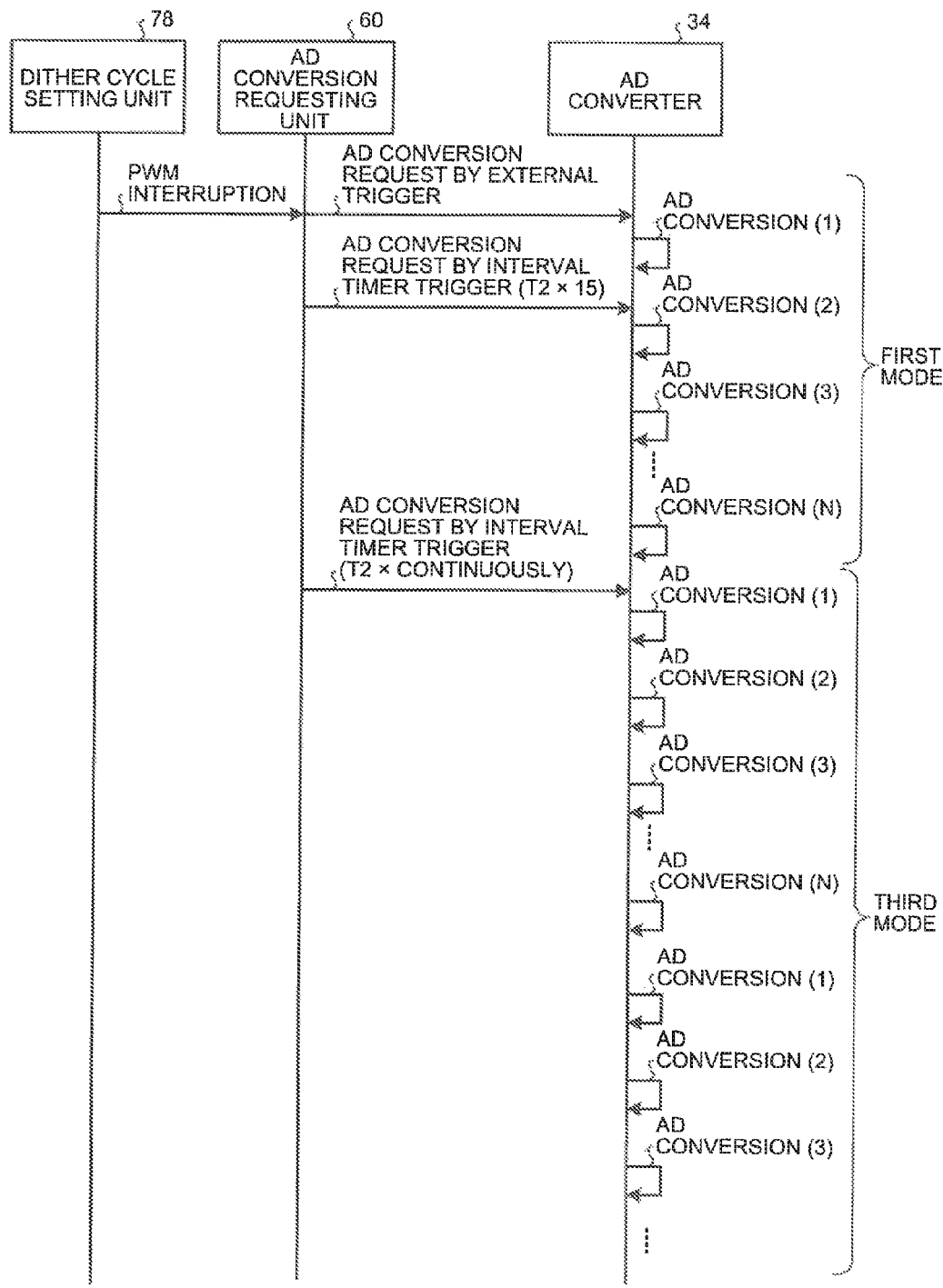
FIG. 9 is a diagram illustrating AD conversions caused by a third-mode AD conversion request.

Next, the third mode will be explained. In the third mode, the AD conversion requesting unit 60 performs, on the AD converter 34, an AD conversion request by using an interval timer trigger whose interval times are constant. FIG. 8 is a diagram illustrating one example of relationship between execution modes and change in the dither cycles Ts. FIG. 9 is a diagram illustrating AD conversions caused by the third-mode AD conversion request.

As illustrated in FIG. 8, when the dither cycle Ts is changed, the AD conversion requesting unit 60 of the AD conversion controller 35 requests the AD converter 34 to execute AD conversions in the first mode (or second mode). For example, the AD conversion requesting unit 60 can determine whether or not the dither cycle Ts is changed on the basis of information on the length of the dither cycle Ts that is sent from the dither cycle setting unit 78.

In such a case that the dither cycle Ts is not changed for "P" or more cycles (P≥2) of the dither component after the dither cycle Ts is changed (P=2 in example illustrated in FIG. 8), the AD conversion requesting unit 60 requests the AD converter 34 to execute AD conversions in the third mode. In this case, the AD conversion requesting unit 60 first causes the AD converter 34 to execute AD conversions in the first mode (or second mode), and then requests the AD converter 34 to execute AD conversions in the third mode.

For example, as illustrated in FIG. 9, when the first-mode AD conversion is completed, the AD conversion requesting unit 60 performs, on the AD converter 34, an AD conversion request (third-mode AD conversion request) by using an interval timer trigger whose interval time is set to be the second time T2 and whose number of the repeated counts of AD conversions is not defined.

When there exists the AD conversion request by the interval timer trigger from the AD conversion controller 35, the controller 40 causes the timer 43 to start to count so as to cause the AD processing unit 41 to start an AD conversion at each time when the count value of the timer 43 becomes the second time T2. Thus, the AD converter 34 repeatedly executes an AD conversion at intervals of the second time T2.

When the mode is shifted from the first mode to the third mode, the aforementioned processing time T4 is needed, and thus the number of the counts of the AD conversions becomes "N−1" in the first dither cycle Ts after the cycle length is changed, however, the "N" AD conversions are executed in the respective later dither cycles Ts. Therefore, timings of the AD conversions can be set appropriately from the dither cycle Ts after that whose mode is shifted to the third mode. In this case, the dither cycles To are delayed from the PWM-interruption timing by processing time T4.

The AD-converted value acquiring unit 61 requests the controller 40 to memorize the "N" AD-converted values Iod in the RAM 32 by using the Direct Memory Access transfer (DMA transfer) at the first PWM-interruption timing of the shift to the third mode. Thus, the controller 40 transfers the AD-converted value Iod memorized in the data register 42 to a predetermined region of the RAM 32 for each AD conversion by using the DMA transfer, and, when the DMA transfer is completed, performs a transfer completing notification.

When a predetermined region of the RAM 32 is used as a memory region of the AD-converted value acquiring unit 61, the AD-converted value acquiring unit 61 can acquire "N" AD-converted values Iod. At each time when there exists the transfer completing notification from the AD converter 34, the AD-converted value acquiring unit 61 repeatedly requests, for example, the controller 40 to memorize the "N" AD-converted values Iod in the RAM 32 by using the DMA transfer.

The third-mode AD conversion request does not define the repeated counts of AD conversions, and thus any AD conversion completing interruption to the AD conversion controller 35 from the AD converter 34 is not performed. Therefore, AD conversion timings of the driving current Io including a superimposed dither component can be appropriately set while more reducing the processing load compared with the case where the first mode or the second mode is executed.

In the aforementioned example, the case is explained where the length of the dither cycle Ts is changed, however, when the length the dither cycle Ts is fixed, the AD conversion controller 35 may also continuously perform the third-mode AD conversion request.

3. Process Executed by AD Conversion Controller

Figure 10:
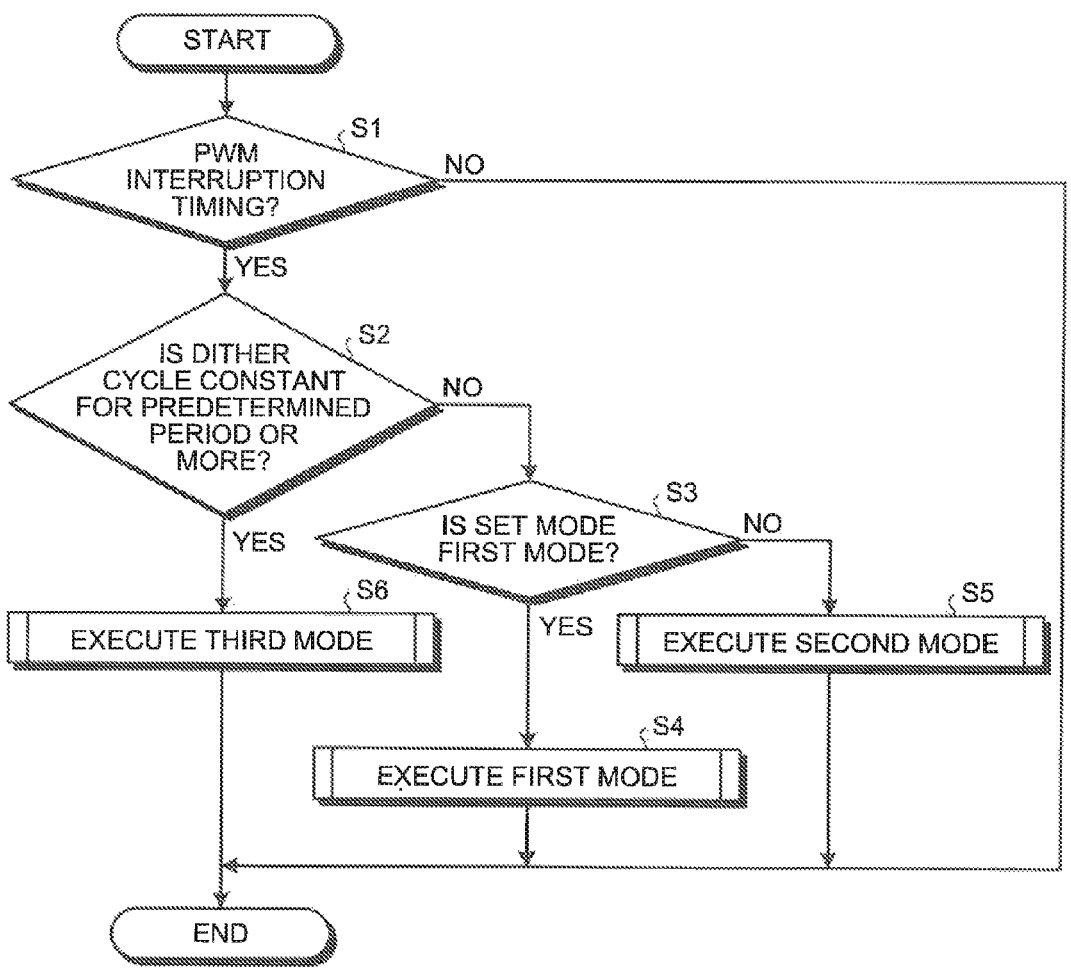
FIG. 10 is a flowchart illustrating one example of a processing procedure executed by the AD conversion controller.

Next, one example of processing procedures of the AD conversion controller 35 will be explained by using flowcharts. FIG. 10 is a flowchart illustrating one example of a processing procedure executed by the AD conversion controller 35, and the process is repeatedly executed.

As illustrated in FIG. 10, the AD conversion controller 35 first determines whether or not it is a PWM-interruption timing (Step S1). When determining that it is the PWM-interruption timing (Step S1: Yes), the AD conversion controller 35 determines whether or not the dither cycle Ts is constant for a predetermined time period Tth (for example, time period of "P" cycles of dither component) or more (Step S2).

When determining that the dither cycle Ts is not constant for a predetermined time period Tth or more (Step S2: No), the AD conversion controller 35 determines whether or not a set mode is the first mode (Step S3). This set mode is set by, for example, an operator or a user from the outside of the control device 1.

When determining that the set mode is the first mode (Step S3: Yes), the AD conversion controller 35 executes a first-mode AD conversion request (Step S4). Otherwise (Step S3: No), the AD conversion controller 35 executes a second-mode AD conversion request (Step S5). In Step S2, when determining that the dither cycle Ts is constant for a predetermined time period Tth or more (Step S2: Yes), the AD conversion controller 35 performs a third-mode AD conversion request (Step S6).

When determining that it is not the PWM-interruption timing (Step S1: No), or when any of processes of Steps S4, S5, and S6 is terminated, the AD conversion controller 35 repeats the process from Step S1.

Figure 11:
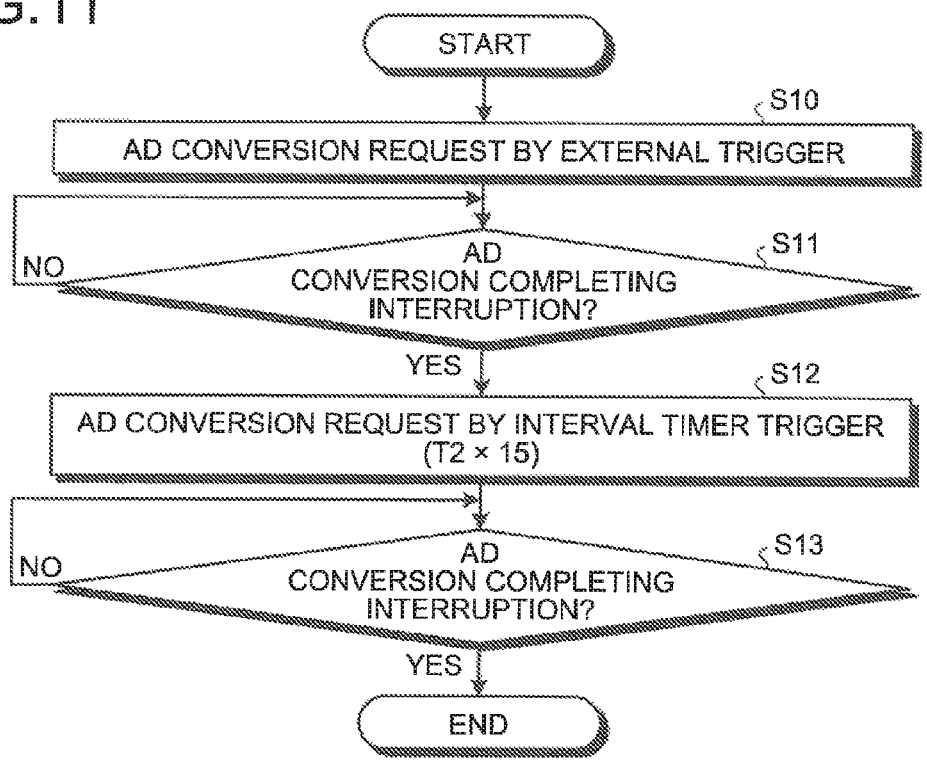
FIG. 11 is a flowchart illustrating a processing procedure of the first-mode AD conversion request that is executed at Step S4 illustrated in FIG. 10.

FIG. 11 is a flowchart illustrating a processing procedure of the first-mode AD conversion request that is executed at Step S4 illustrated in FIG. 10. As illustrated in FIG. 11, the AD conversion controller 35 executes an AD conversion request by using an external trigger on the AD converter 34 (Step S10), and subsequently, waits an AD conversion completing interruption from the AD converter 34 (Step S11).

When determining that there exists the AD conversion completing interruption from the AD converter 34 (Step S11: Yes), the AD conversion controller 35 performs, on the AD converter 34, an AD conversion request by using an interval timer trigger whose interval time is set to the second time T2 and whose number of repeated counts of AD conversions is set to "N" (Step S12).

Subsequently, the AD conversion controller 35 waits the AD conversion completing interruption from the AD converter 34 (Step S13), when determining that there exists the AD conversion completing interruption from the AD converter 34 (Step S13: Yes), terminates the process illustrated in FIG. 11.

Figure 12:
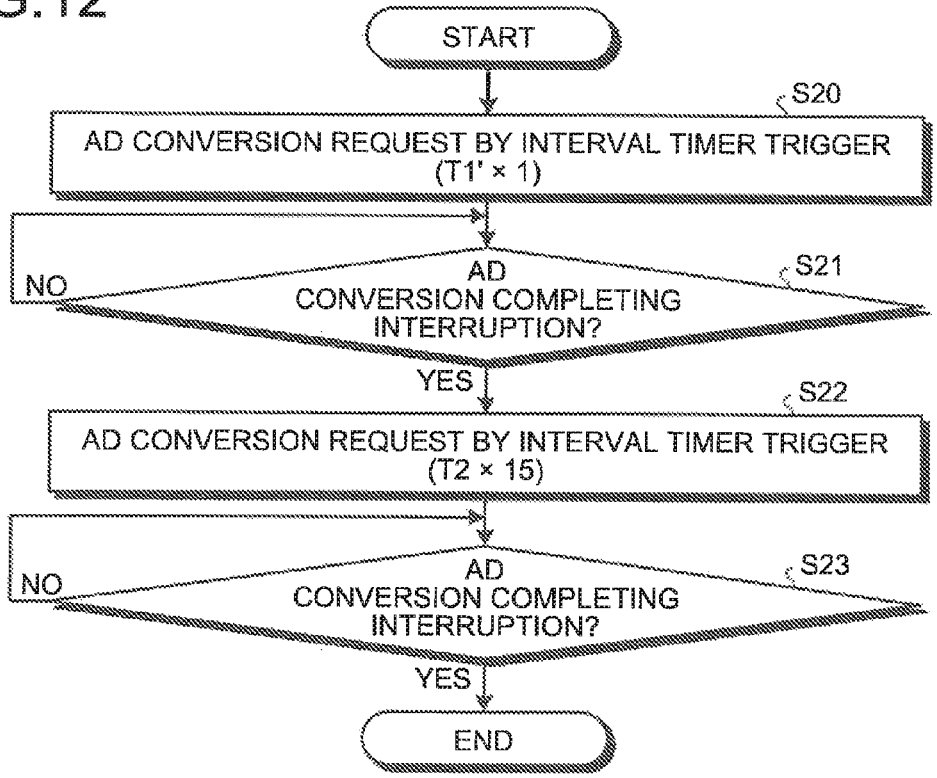
FIG. 12 is a flowchart illustrating a processing procedure of the second-mode AD conversion request that is executed at Step S5 illustrated in FIG. 10.

FIG. 12 is a flowchart illustrating a processing procedure of the second-mode AD conversion request that is executed at Step S5 illustrated in FIG. 10. As illustrated in FIG. 12, the AD conversion controller 35 performs, on the AD converter 34, an AD conversion request by using an interval timer trigger whose interval time is set to be the time T1' (≤T1−T4) that is shorter than the first time T1 and whose number of repeated counts of AD conversions is one (Step S20).

Subsequently, the AD conversion controller 35 waits an AD conversion completing interruption from the AD converter 34 (Step S21). When determining that there exists the AD conversion completing interruption from the AD converter 34 (Step S21: Yes), the AD conversion controller 35 executes processes similar to those of Steps S12 and S13 illustrated in FIG. 11 (Steps S22 and S23), and terminates the process illustrated in FIG. 12.

The AD conversion controller 35 may acquire, in the first or second mode, the AD-converted value Iod from the AD converter 34 at each time when there exists the AD conversion completing interruption, or when determining that there exists the AD conversion completing interruption in Step S13, the AD conversion controller 35 may acquire, at a time, the "N" AD-converted values Iod from the AD converter 34.

Figure 13:
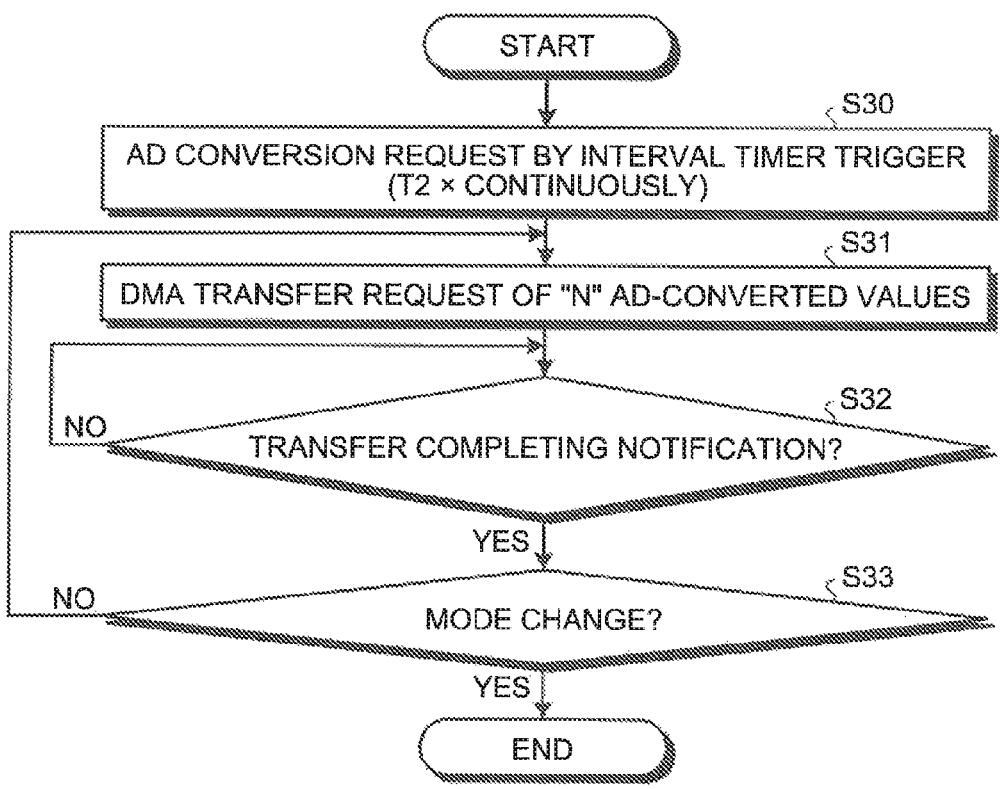
FIG. 13 is a flowchart illustrating a processing procedure of the third-mode AD conversion request that is executed at Step S6 illustrated in FIG. 10.

FIG. 13 is a flowchart illustrating a processing procedure of the third-mode AD conversion request that is executed at Step S6 illustrated in FIG. 10. As illustrated in FIG. 13, the AD conversion controller 35 performs, on the AD converter 34, an AD conversion request by using an interval timer trigger whose interval time is set to be the second time T2 and whose numbers of repeated counts of AD conversions is not defined (Step S30).

The AD conversion controller 35 performs an DMA-transfer request with respect to the "N" AD-converted values Iod (Step S31), and determines whether or not there exists a transfer completing notification from the AD converter 34 in response to this DMA-transfer request (Step S32). When determining that there exists the transfer completing notification (Step S32: Yes), the AD conversion controller 35 determines whether or not it is a mode-change timing (Step S33). For example, when the length of the dither cycle Ts is to be changed from the next PWM-interruption timing, the AD conversion controller 35 determines that it is the mode-change timing.

When determining that it is not the mode-change timing (Step S33: No), the AD conversion controller 35 returns the process to Step S31, and, when determining that it is the mode-change timing (Step S33: Yes), terminates the process illustrated in FIG. 13.

As described above, the control device 1 according to the embodiment includes the driving unit 20, the output unit 21, the AD converter 34 (one example of AD converter), the AD conversion controller 35, and the drive controller 36. The driving unit 20 supplies, to the control target 2, the current or the voltage on which the AC component is superimposed. The output unit 21 outputs the detection voltage Ed according to the current or the voltage supplied to the control target 2 (for example, linear solenoid valve 2a) from the driving unit 20. The AD converter 34 executes an AD conversion on the detection voltage Ed to generate the AD-converted value Edd. The AD conversion controller 35 causes the AD converter 34 to execute the AD conversion at a plurality of timings in the AC cycle TS of the AC component to acquire the plurality of AD-converted values Edd. The drive controller 36 controls the current or the voltage to be supplied to the control target 2 from the driving unit 20 on the basis of the plurality of AD-converted values Edd. The AD conversion controller 35 causes, in the AC cycle TS of the AC component, the AD converter 34 to execute the first AD conversion in synchronization with the PWM-interruption timing (one example of starting timing of AC cycle TS), and then to execute the second and subsequent AD conversions of the plurality of AD conversions at predetermined time intervals in response to the trigger by the timer 43 (one example of internal timer) of the AD converter 34. For example, the AD conversion controller 35 causes, in the AC cycle TS of the AC component, the AD converter 34 to execute the first AD conversion in the first time T1 from the PWM-interruption timing, and then to execute the second and subsequent AD conversions of the plurality of AD conversions at intervals of the second time T2 longer than the first time T1 in response to the trigger by the timer 43 (one example of internal timer) of the AD converter 34. Thus, the AD conversion timings of the AC component can be set appropriately while reducing the processing load.

The AD conversion controller 35 outputs, to the AD converter 34, the trigger (for example, software trigger or hardware trigger) of the AD conversion to cause the AD converter 34 to execute the first AD conversion in the first time T1 from the PWM-interruption timing. Thus, the AD converter 34 can execute accurately the first AD conversion in the first time T1.

The AD conversion controller 35 requests one AD conversion in response to the trigger by the timer 43 in which the time interval is set to be the time T1' shorter than the first time T1 to cause the AD converter 34 to execute the first AD conversion in the first time T1 from the PWM-interruption timing. Thus, the AD converter 34 can also execute accurately the first AD conversion in the first time T1.

The control device 1 according to the embodiment further includes the dither cycle setting unit 78 (one example of change unit) that changes the frequency fs (=1/Ts) of the dither component (one example of AC component) on the basis of a predetermined condition (for example, condition that target current value Ioref is predetermined value or less). The AD conversion controller 35 changes the second time T2 in accordance with the change in the frequency fs performed by the dither cycle setting unit 78 to keep the number of the AD conversions constant in the dither cycle Ts (one example of AC cycle). Thus, even when the dither cycle Ts is changed, the AD conversion timings for the dither component can be set appropriately while reducing the processing load.

When the frequency fs of the dither component (one example of AC component) is constant for the predetermined time period Tth or more, the AD conversion controller 35 requests the AD converter 34 to execute the AD conversions in response to the trigger by the timer 43, and causes the AD converter 34 to execute, from the first AD conversion in the dither cycle Ts, the AD conversions in response to the trigger by the timer 43. Thus, the timings of the AD conversions for the dither component can be set appropriately while more reducing the processing load compared with, for example, the case where the first mode and/or the second mode are executed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A control device comprising:
a driving unit that supplies, to a control target, a current or a voltage on which an Alternating-Current (AC) component is superimposed;
an output unit that outputs a detection voltage according to the current or the voltage supplied to the control target from the driving unit;
an Analog-to-Digital (AD) converter that performs an AD conversion on the detection voltage;
an AD conversion controller that causes the AD converter to execute the AD conversion at a plurality of timings in an AC cycle of the AC component to acquire a plurality of AD-converted values; and
a drive controller that controls the current or the voltage to be supplied to the control target from the driving unit based on the plurality of AD-converted values, wherein
the AD conversion controller causes, in the AC cycle, the AD converter to execute a first AD conversion in synchronization with a starting timing of the AC cycle, and then to execute second and subsequent AD conversions of the plurality of AD conversions at predetermined time intervals in response to a trigger by an internal timer of the AD converter.

2. The control device according to claim 1, wherein the AD conversion controller causes, in the AC cycle, the AD converter to execute the first AD conversion in a first time from the starting timing of the AC cycle, and then to execute the second and subsequent AD conversions at intervals of a second time longer than the first time in response to the trigger by the internal timer of the AD converter.

3. The control device according to claim 2, wherein the AD conversion controller outputs, to the AD converter, a trigger of the AD conversion to cause the AD converter to execute the first AD conversion in the first time from the starting timing of the AC cycle.

4. The control device according to claim 2, wherein the AD conversion controller requests one AD conversion in response to a trigger by the internal timer in which a time interval is set to be shorter than the first time to cause the AD converter to execute the first AD conversion in the first time from the starting timing of the AC cycle.

5. The control device according to claim 2, further comprising a change unit that changes a frequency of the AC component based on a predetermined condition, wherein
the AD conversion controller changes the second time in accordance with the change of the frequency performed by the change unit to keep a number of the AD conversions constant in the AC cycle.

6. The control device according to claim 5, wherein, when the frequency of the AC component is constant for a predetermined time period or more, the AD conversion controller requests the AD converter to execute the AD conversions in response to the trigger by the internal timer, and causes the AD converter to execute, from the first AD conversion, the AD conversions in response to the trigger by the internal timer.

7. An AD conversion controlling method comprising:
outputting, to an AD converter, a detection voltage according to a current or a voltage on which an AC component is superimposed; and
causing the AD converter to perform an AD conversion on the detection voltage at a plurality of timings in an AC cycle of the AC component, wherein
the causing includes causing, in the AC cycle, the AD converter to execute a first AD conversion in synchronization with a starting timing of the AC cycle, and then to execute second and subsequent AD conversions of the plurality of AD conversions at predetermined time intervals in response to a trigger by an internal timer of the AD converter.

* * * * *